US 8,570,756 B2

(12) United States Patent
Sakai et al.

(10) Patent No.: US 8,570,756 B2
(45) Date of Patent: Oct. 29, 2013

(54) SLIDING ELECTRONIC APPARATUS

(75) Inventors: Takahiro Sakai, Minato-ku (JP);
Toshiki Yamanaka, Kakegawa (JP);
Hiroshi Yamada, Kakegawa (JP)

(73) Assignee: NEC Corporation, Tokyo (JP)

( * ) Notice: Subject to any disclaimer, the term of this patent is extended or adjusted under 35 U.S.C. 154(b) by 206 days.

(21) Appl. No.: 13/130,394

(22) PCT Filed: Nov. 24, 2009

(86) PCT No.: PCT/JP2009/069765
§ 371 (c)(1),
(2), (4) Date: May 20, 2011

(87) PCT Pub. No.: WO2010/073862
PCT Pub. Date: Jul. 1, 2010

(65) Prior Publication Data
US 2011/0228491 A1    Sep. 22, 2011

(30) Foreign Application Priority Data

Dec. 25, 2008    (JP) ................................. 2008-330803

(51) Int. Cl.
*H05K 5/00*    (2006.01)
(52) U.S. Cl.
USPC ........... 361/752; 361/753; 361/756; 361/758; 361/760
(58) Field of Classification Search
USPC ........... 361/679.56, 752, 753, 756, 758, 760, 361/761, 792, 727, 741, 796
See application file for complete search history.

(56) References Cited

U.S. PATENT DOCUMENTS 5,563,378 A    10/1996 Uchida et al.
7,505,278 B2 *    3/2009 Choi et al. .................... 361/749
(Continued)

FOREIGN PATENT DOCUMENTS

CN    101005664 A    7/2007
EP    1990703 A1    11/2008
(Continued)

OTHER PUBLICATIONS

Office Action dated May 27, 2013; issued by the State Intellectual Property Office of P.R. China.; in Chinese Application No. 200980152651.X.

*Primary Examiner* — Jayprakash N Gandhi
*Assistant Examiner* — Hung Dang
(74) *Attorney, Agent, or Firm* — Sughrue Mion, PLLC

(57) ABSTRACT

A sliding electronic apparatus that prevents foreign matter from entering a housing is provided. In the apparatus, upper housing 1 and lower housing 2 are slidably coupled, and it is switched by sliding one of upper housing 1 and lower housing 2 with respect to the other, a closed state in which operation section 2*b* provided on lower housing 2 is covered by upper housing 1 and an open state in which operation section 2*b* is exposed. The apparatus includes opening 1*c* formed in a lower surface of upper housing 1, opening 2*c* formed in an upper surface of lower housing 2, and FPC 3 for electrically connecting wiring board 9 and wiring board 10. FPC 3 includes cover portion 3*a* mounted on the lower surface of upper housing 1 so as to cover opening 1*c* and cover portion 3*b* mounted on the upper surface of lower housing 2 so as to cover opening 2*c*. Cover portion 3*a* is electrically connected to wiring board 9 in upper housing 1, and cover portion 3*b* is electrically connected to wiring board 10 in lower housing 2.

13 Claims, 6 Drawing Sheets

(56) References Cited

U.S. PATENT DOCUMENTS

| | | | |
|---|---|---|---|
| 7,660,410 B2 * | 2/2010 | Mizushina | 379/433.07 |
| 7,660,411 B2 * | 2/2010 | Oi | 379/433.12 |
| 8,055,315 B2 * | 11/2011 | Komiyama | 455/575.1 |
| 8,233,948 B2 * | 7/2012 | Francisco et al. | 455/575.4 |
| 2007/0123322 A1 | 5/2007 | Mizushina | |
| 2007/0211889 A1 | 9/2007 | Oi | |
| 2009/0052126 A1 | 2/2009 | Komiyama | |
| 2009/0168339 A1 * | 7/2009 | Lee | 361/679.56 |

FOREIGN PATENT DOCUMENTS

| | | |
|---|---|---|
| JP | 2003-234809 A | 8/2003 |
| JP | 2004153597 A | 5/2004 |
| JP | 2005-136601 A | 5/2005 |
| JP | 2006-115144 A | 4/2006 |
| JP | 2006-157465 A | 6/2006 |
| JP | 2007-179525 A | 7/2007 |
| JP | 2008-147916 A | 6/2008 |
| WO | 2005/117399 A1 | 12/2005 |
| WO | 2007/100023 A1 | 9/2007 |

* cited by examiner

SLIDING ELECTRONIC APPARATUS

CROSS REFERENCE TO RELATED APPLICATIONS

This application is a National Stage of International Application No. PCT/JP2009/069765, filed on Nov. 24, 2009, which claims priority from Japanese Patent Application No. 2008-330803, filed on Dec. 25,2008, the contents of all of which are incorporated herein by reference in their entirety.

TECHNICAL FIELD

The present invention relates to a sliding electronic apparatus which can be opened and closed.

BACKGROUND ART

Some small-sized electronic apparatuses such as mobile phones involve various opening and closing operations. Sliding electronic apparatuses are a kind of such electronic apparatus.

FIG. 1A and FIG. 1B are longitudinal side cross-sectional views of a common sliding electronic apparatus. Here, in FIG. 1A, the direction of arrow (a) is defined as a "forward" direction. The direction of arrow (b) is defined as a "backward" direction.

This sliding electronic apparatus includes upper housing 101 with display section 101b on an upper surface thereof and lower housing 102 with operation section 102b on an upper surface thereof.

FIG. 1A shows a closed state in which upper housing 101 is laid on top of lower housing 102 such that a lower surface of upper housing 101 lies opposite the entire upper surface of lower housing 102 of the sliding electronic apparatus. Thus, in the closed state of the sliding electronic apparatus, operation section 102b on the upper surface of lower housing 102 is covered by upper housing 101 and is thus inoperative.

Furthermore, the sliding electronic apparatus is switched from the closed state to an open state by sliding upper housing 101 forward with respect to lower housing 102. FIG. 1B shows the open state of the sliding electronic apparatus. In this case, upper housing 101 is moved forward away from operation section 102b of lower housing 102, thus making operation section 102b operative.

Thus, when out of use, the sliding electronic apparatus is set to the closed state in which the apparatus has a reduced size in a longitudinal direction thereof, and is thus easy to carry. Moreover, in the closed state, operation section 102b is covered by upper housing 101, thus preventing operation section 102b from being erroneously operated while the apparatus is being carried by a user. Furthermore, when the sliding electronic apparatus is to be used, operation section 102b can be easily made operative by switching the sliding electronic apparatus from the closed state to the open state. This prevents the operability of the sliding electronic apparatus from being degraded.

Upper housing 101 and lower housing 102 accommodate wiring board 109 and wiring board 110, respectively. Furthermore, opening 101c is formed in a lower surface of upper housing 101, and opening 102c is formed in an upper surface of lower housing 102.

The sliding electronic apparatus includes FPC board 103 that is configured to electrically connect wiring board 109 in upper housing 101 to wiring board 110 in lower housing 102. FPC stands for a Flexible Printed Circuit. One end of FPC 103 is drawn through opening 101c into upper housing 101 and connected to wiring board 109 arranged in upper housing 101. The other end of FPC 103 is drawn through opening 102c into lower housing 102 and is connected to wiring board 110 arranged in lower housing 102.

Thus, the sliding electronic apparatus can transmit an operation instruction resulting from operation of operation section 102b of lower housing 102, to upper housing 101 via FPC 103. Hence, in the sliding electronic apparatus, in accordance with operation instructions from operation section 102b in lower housing 102, functions provided in upper housing 101 can be fulfilled, for example, transmission and reception of electric waves and display of images on display section 101b.

Opening 101c in upper housing 101 is arranged close to a back end of upper housing 101 so as to lie opposite the upper surface of lower housing 102 even in the open state. Opening 102c in lower housing 102 is arranged close to a front end of lower housing 102 so as to lie opposite the lower surface of upper housing 101 even in the open state.

Therefore, in the sliding electronic apparatus, in the open state, opening 101c in upper housing 101 lies opposite the upper surface of second housing 102, whereas opening 102c in lower housing 102 lies opposite first housing 101. Thus, dirt and the like can be prevented from entering upper housing 101 and lower housing 102 through opening 101c and opening 102c.

Furthermore, FPC 103 extends forward from opening 101c in upper housing 101 to U-shaped portion 103c arranged in front of opening 102c in lower housing 102. FPC 103 then turns around at U-shaped portion 103c and extends backward to opening 102c in lower housing 102.

In the closed state shown in FIG. 1A, U-shaped portion 103c of FPC 103 is arranged close to opening 102c in lower housing 102. In the sliding electronic apparatus, as upper housing 101 is slid forward with respect to lower housing 102 from the closed state, FPC 103 moves U-shaped portion 103c forward with the formation position of U-shaped portion 103c varied.

Thus, when the sliding electronic apparatus is in the open state as shown in FIG. 1B, U-shaped portion 103c of FPC 103 is positioned closer to the front end of the lower housing than when the sliding electronic apparatus is in the closed state as shown in FIG. 1A. However, the sliding electronic apparatus is configured such that U-shaped portion 103c of FPC 103 is prevented from protruding forward from the upper surface of lower housing 102 even in the open state. Hence, FPC 103 is prevented from moving out from the gap between upper housing 101 and lower housing 102 and is thus unlikely to be damaged.

Furthermore, the sliding electronic apparatus is switched from the open state to the closed state by an operation opposite to that of switching from the closed state to the open state. That is, the sliding electronic apparatus is switched from the open state shown in FIG. 1B to the closed state shown in FIG. 1A by sliding upper housing 101 backward with respect to lower housing 102.

As described above, the sliding electronic apparatus enables opening and closing operations with electric connection maintained between wiring board 109 in upper housing 101 and wiring board 110 in lower housing 102.

Techniques related to the present invention are described in Patent Literatures 1 to 3.

CITATION LIST

Patent Literature
Patent Literature 1: JP2006-157465A

Patent Literature 2: JP2006-115144A

Patent Literature 3: JP2005-136601A

SUMMARY OF INVENTION

Technical Problem

However, in the sliding electronic apparatus shown in FIG. 1A and FIG. 1B, foreign matter such as dirt or a liquid may enter the gap between upper housing 101 and lower housing 102. At this time, foreign matter may enter the inside of upper housing 101 and lower housing 102 through opening 101c and opening 102c, respectively, arranged in the gap between upper housing 101 and lower housing 102. Then, the sliding electronic apparatus may become defective.

To prevent this, the gap between upper housing 101 and lower housing 102 may be blocked with a member such as a cushion. However, complete blockage of the gap makes sliding of upper housing 101 with respect to lower housing 102 difficult. This precludes the sliding electronic apparatus from being opened or closed.

Furthermore, opening 101c in upper housing 101 and opening 102c in lower housing 102 may each be blocked with a plug formed of rubber or the like. However, since FPC 103 is passed through openings 101c and 102c, a gap needs to be formed in the plug so that FPC 103 can be passed through the gap. Thus, completely blocking openings 101c and 102c with the plugs is difficult. Additionally, when openings 101c and 102c are provided with the plugs, the plugs project out from housings 101 and 102 through openings 101c and 102c, respectively. This makes the sliding electronic apparatus thicker.

Thus, an object of the present invention is to provide a sliding electronic apparatus configured to be able to prevent foreign matter from entering the housing.

Solution to Problem

To accomplish this object, the present invention provides a sliding electronic apparatus in which a first housing and a second housing laid on top of each other are coupled together so as to be able to slide relative to each other, the sliding electronic apparatus being switchable, by sliding one housing, from among the first housing and the second housing, with respect to each other, between a closed state in which an operation section provided on the second housing is covered by the first housing and an open state in which the operation section is exposed, the sliding electronic apparatus comprising a first wiring board accommodated in the first housing, a second wiring board accommodated in the second housing, a first opening formed in an opposite surface of the first housing which lies opposite the second housing, a second opening formed in an opposite surface of the second housing which lies opposite the first housing, and a flexible printed circuit configured to electrically connect the first wiring board and the second wiring board together, and the flexible printed circuit includes a first cover portion mounted on the opposite surface of the first housing so as to cover the first opening and a second cover portion mounted on the opposite surface of the second housing so as to cover the second opening, and the first cover portion is electrically connected to the first wiring board and the second cover portion is electrically connected to the second wiring board.

Advantageous Effects of Invention

The present invention can provide a sliding electronic apparatus configured to be able to prevent foreign matter from entering the housing.

DESCRIPTION OF EMBODIMENT

Now, an exemplary embodiment of the present invention will be described with reference to the drawings.

Figure 1A:
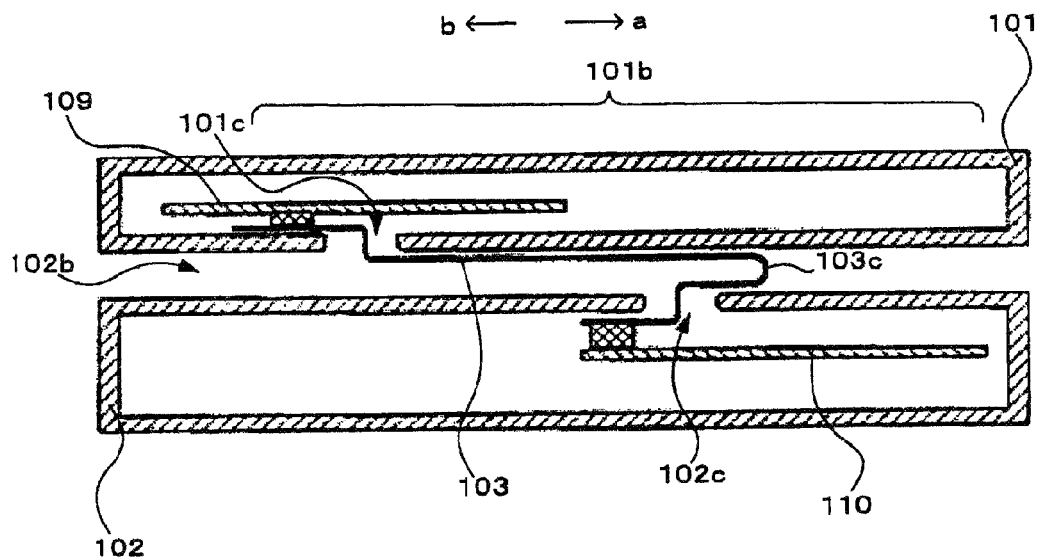
FIG. 1A is a side cross-sectional view of a common sliding electronic apparatus in a closed state.
Figure 1B:
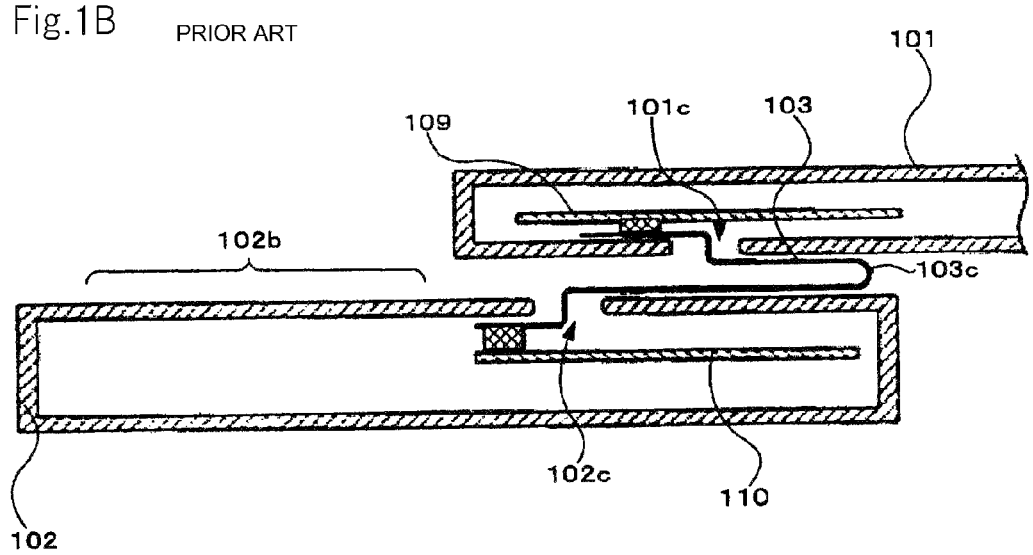
FIG. 1B is a side cross-sectional view of the sliding electronic apparatus shown in FIG. 1A and which is in an open state.
Figure 2A:
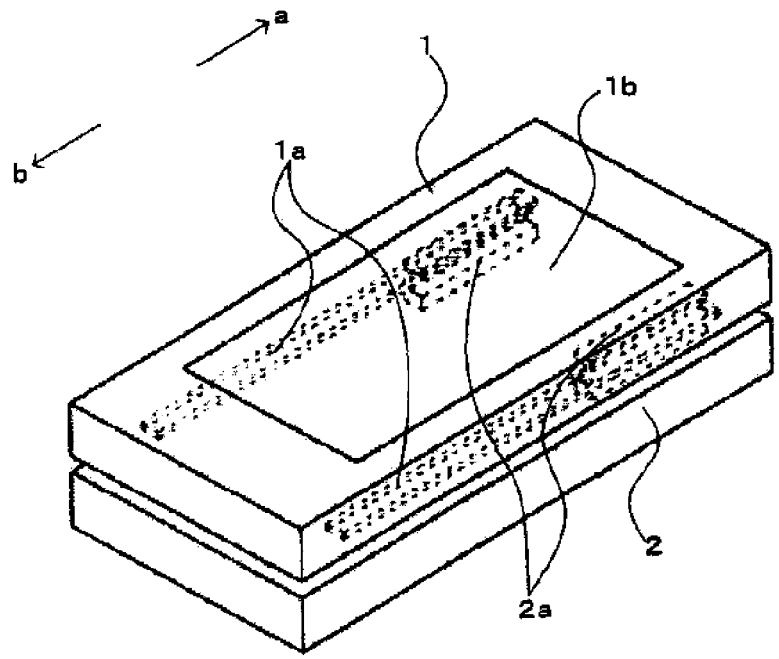
FIG. 2A is a perspective view of the sliding electronic apparatus according to an exemplary embodiment of the present invention which is in the closed state.
Figure 2B:
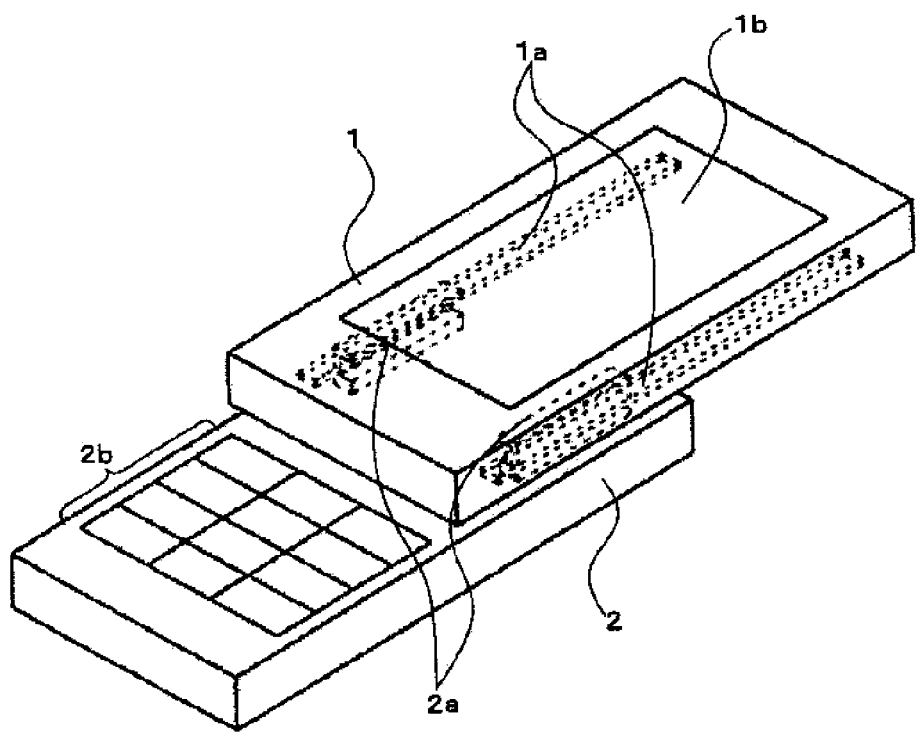
FIG. 2B is a perspective view of the sliding electronic apparatus shown in FIG. 2A and which is in the open state.

FIGS. 2A and 2B are perspective views of a sliding electronic apparatus according to the exemplary embodiment of the present invention. FIG. 2A shows a closed state of the sliding electronic apparatus. FIG. 2B shows an open state of the sliding electronic apparatus.

In the exemplary embodiment, a mobile phone as an example of a sliding electronic apparatus will be described. Other examples of sliding electronic equipment may be, for example, a notebook personal computer, a mobile information terminal (PDA: Personal Digital Assistants), a digital camera, or a digital video camera. These sliding electronic apparatuses can be configured in the same manner as that in the exemplary embodiment.

The sliding electronic apparatus includes upper housing 1 that is a first housing with display section 1b on an upper surface thereof and lower housing 2 that is a second housing with operation section 2b on an upper surface thereof. The sliding electronic apparatus is opened and closed by sliding upper housing 1 with respect to lower housing 2 in a longitudinal direction.

Here, a term "forward (or front)" is defined as a first direction (the direction of arrow (a) in FIG. 2A) in which upper housing 1 is moved with respect to lower housing 2 in order to switch the sliding electronic apparatus from a closed state to an open state. In contrast, a term "backward (or back)" is defined as a second direction (the direction of arrow (b) in FIG. 2A) in which upper housing 1 is moved with respect to lower housing 2 in order to switch the sliding electronic apparatus from the open state to the closed state.

Guide rails 1a are provided at the respective laterally opposite ends of the lower surface of upper housing 1 which extend from front to back. On the other hand, slide portions 2a that engage with respective guide rails 1a are provided in the front of the upper surface of lower housing 2. Each slide portion 2a engages with the front end of the guide rail in the closed state shown in FIG. 2A and with the back end of guide rail 1a in the open state shown in FIG. 2B. Guide rail 1a can be moved between the front end and back end of the slide portion 2a with the engagement with the slide portion 2a maintained.

As described above, in the sliding electronic apparatus, the engagement between each guide rail 1a of upper housing 1 and corresponding slide portion 2a of lower housing 2 is always maintained. Thus, the sliding electronic apparatus can be opened and closed without displacing upper housing 1 from lower housing 2.

In the sliding electronic apparatus, operation section 2b is arranged close to the back end of lower housing 2. Thus, in the closed state shown in FIG. 2A, operation section 2b on the upper surface of lower housing 2 is covered by upper housing 1 and cannot be operated. However, when the sliding electronic apparatus is switched to the open state shown in FIG. 2B, upper housing 1 moves forward away from operation section 2b of lower housing 2. This makes operation section 2b operative.

Figure 3:
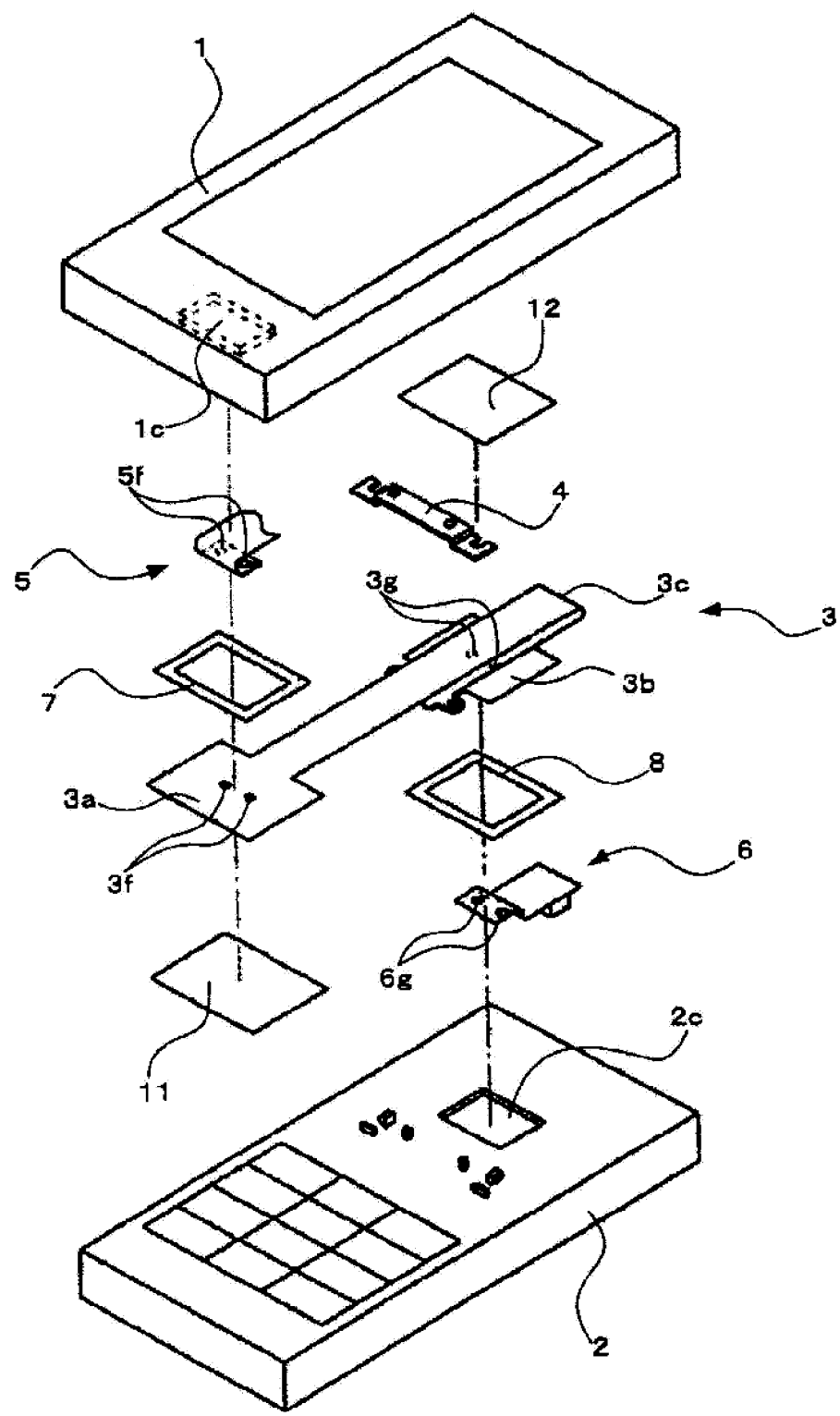
FIG. 3 is an exploded perspective view of the sliding electronic apparatus shown in FIG. 2A.

FIG. 3 is an exploded perspective view of the sliding electronic apparatus according to the exemplary embodiment. The illustration of guide rail 1a and slide portion 2a is omitted from FIG. 3.

The sliding electronic apparatus includes FPC 3 with wiring provided on each of the opposite sides thereof. FPC 3 includes first cover portion 3a provided at one end thereof and attached to upper housing 1 and second cover portion 3b provided at the other end thereof and attached to lower housing 2. Furthermore, an intermediate portion between cover portion 3a and cover portion 3b of FPC 3 extends forward from cover portion 3a to U-shaped portion 3c, turns around downward at U-shaped portion 3c, and extends further backward. The configuration of the vicinity of cover portion 3b of FPC 3 will be described below.

First opening 1c is formed in a lower surface of upper housing 1 which lies opposite lower housing 2. Furthermore, double sided adhesive tape 7 formed like a frame and arranged so as to enclose opening 1c all along the periphery thereof is provided on a lower surface of upper housing 1; double sided adhesive tape 7 serves as an adhesive member. Cover portion 3a of FPC 3 is mounted on the lower surface of upper housing 1 via double sided adhesive tape 7 so as to cover entire opening 1c. Since double sided adhesive tape 7 is arranged all along the periphery of opening 1c, no gap is formed between cover portion 3a and the lower surface of upper housing 1.

Thus, the sliding electronic apparatus prevents foreign matter from entering upper housing 1 through opening 1c without the need to provide any member that may degrade the operability of opening and closing operations or to increase the thickness of the sliding electronic apparatus.

Furthermore, upper housing 1 contains sub-FPC 5 serving as a first connection section including an independently formed FPC. Sub-FPC 5 electrically connects cover portion 3a of FPC 3 to first wiring board 9 (see FIG. 5A and FIG. 5B) arranged in upper housing 1.

Cover portion 3a of FPC 3 includes positioning holes 3f formed therein. Sub-FPC 5 includes positioning holes 5f formed therein. Sub-FPC 5 is connected to cover portion 3a of FPC 3 with positioning holes 5f aligned with positioning holes 3f.

An ACF (Anisotropic Conductive Film) connection is used to connect sub-FPC 5 to cover portion 3a of FPC 3. The ACF is a film-like insulating resin material in which fine conductive particles are dispersed. In general, the two boards can be electrically connected together by sandwiching the ACF between the two boards and applying pressure and heat to the ACF. Here, the electric connection using the ACF is referred to as the ACF connection.

Second opening 2c is formed on the upper surface of lower housing 2 which lies opposite upper housing 1. Furthermore, on the upper surface of lower housing 2, double sided adhesive tape 8 which is an adhesive member formed like a frame and arranged so as to enclose opening 2c all along the entire periphery thereof, is provided. Cover portion 3b of FPC 3 is mounted on the upper surface of lower housing 2 via double sided adhesive tape 8 so as to cover entire opening 2c. Since double sided adhesive tape 8 is arranged all along the periphery of opening 2c, no gap is formed between cover portion 3b and the upper surface of lower housing 2.

Thus, the sliding electronic apparatus prevents foreign matter from entering lower housing 2 through opening 2c without the need to provide any member that may degrade the operability of opening and closing operations or to increase the thickness of the sliding electronic apparatus.

Furthermore, lower housing 2 contains sub-FPC 6 serving as a second connection section including an independently formed FPC. Sub-FPC 6 electrically connects cover portion 3b of FPC 3 to second wiring board 10 (see FIG. 5A and FIG. 5B) arranged in lower housing 2.

Cover portion 3b of FPC 3 includes positioning hole 3g formed therein. Sub-FPC 6 includes positioning hole 6g formed therein. Sub-FPC 6 is ACF-connected to cover portion 3b of FPC 3 with positioning hole 6g aligned with positioning hole 3g.

Double sided adhesive tapes 7 and 8 are desirably provided so as to surround the entire peripheries of openings 1c and 2c, respectively. However, a double sided adhesive tape may be provided exclusively on a part of the periphery of each of openings 1c and 2c in order to reduce manufacturing costs or to simplify the manufacturing process. This configuration is less effective for preventing foreign matter from entering housings 1 and 2 through openings 1c and 2c, respectively. However, even in this case, the sliding electronic apparatus is configured such that openings 1c and 2c are covered by cover portion 3b of FPC 3, thus significantly suppressing entry of foreign matter into housings 1 and 2 through openings 1c and 2c, respectively, compared to common sliding electronic apparatuses.

Furthermore, cover portions 3a and 3b are covered with tapes 11 and 12, respectively, which serve as cover members and which are externally stuck to upper housing 1 and lower housing 2, respectively. Tapes 11 and 12 are adhesive tapes. Tape 11 is stuck to upper housing 1 with an adhesive surface facing the lower surface of upper housing 1. Tape 12 is stuck to lower housing 2 with an adhesive surface facing the upper surface of lower housing 2.

Thus, positioning holes 3f in cover portion 3a and positioning holes 3g in cover portion 3b are blocked by tapes 11 and 12. This configuration prevents foreign matter from entering upper housing 1 and lower housing 2 through positioning holes 3f and positioning holes 3g, respectively. Tapes 11 and 12 also serve to prevent cover portions 3a and 3b of FPC 3 from being displaced from upper housing 1 and lower housing 2.

Tapes 11 and 12 may come into sliding contact with the upper surface of lower housing 2 and the lower surface of upper housing 1, respectively, to hinder upper housing 1 from sliding with respect to lower housing 2 during the sliding electronic apparatus opening and closing operation. Thus, tapes 11 and 12 are desirably formed of a material that slides easily with respect to the upper surface of lower housing 2 and the lower surface of upper housing 1 and are formed to be thin.

Positioning holes 3*f* and 3*g* in FPC 3 may be formed outside cover portions 3*a* and 3*b*, respectively, of FPC 3. In this case, positioning holes 3*f* and positioning holes 3*g* are prevented from being in communication with the inside of upper housing 1 and lower housing 2, respectively. This eliminates the need to block positioning holes 3*f* and 3*g* using tapes 11 and 12.

In this case, sub-FPCs 5 and 6 are mounted on cover portions 3*a* and 3*b*, for example, as follows. That is, sub-FPCs 5 and 6 are provided with margin portions with positioning holes 5*f* and 6*g* formed therein and corresponding to positioning holes 3*f* and 3*g* in FPC 3. Sub-FPCs 5 and 6 are ACF-connected to cover portions 3*a* and 3*b* of FPC 3 with positioning holes 5*f* and 6*g* aligned with positioning holes 3*f* and 3*g*. At this time, the margin portions of sub-FPCs 5 and 6 are located outside cover portions 3*a* and 3*b*. Hence, when cover portions 3*a* and 3*b* are mounted on upper housing 1 and lower housing 2, the margin portions of sub-FPCs 5 and 6 interfere with the mounting. To prevent this, the margin portions of sub-FPCs 5 and 6 are cut and removed.

Furthermore, the sliding electronic apparatus is not limited to the configuration in which the sub-FPCs 5 and 6 electrically connect cover portions 3*a* and 3*b* to wiring boards 9 and 10, respectively. For example, the configuration may be such that the cover portions 3*a* and 3*b* are connected to wiring boards 9 and 10, respectively, via connectors or such that cover portions 3*a* and 3*b* are connected directly to wiring boards 9 and 10, respectively.

Now, with reference to FIG. 4A and FIG. 4B, the configuration of the vicinity of cover portion 3*b* of FPC 3 of the sliding electronic apparatus will be described.

Figure 4A:
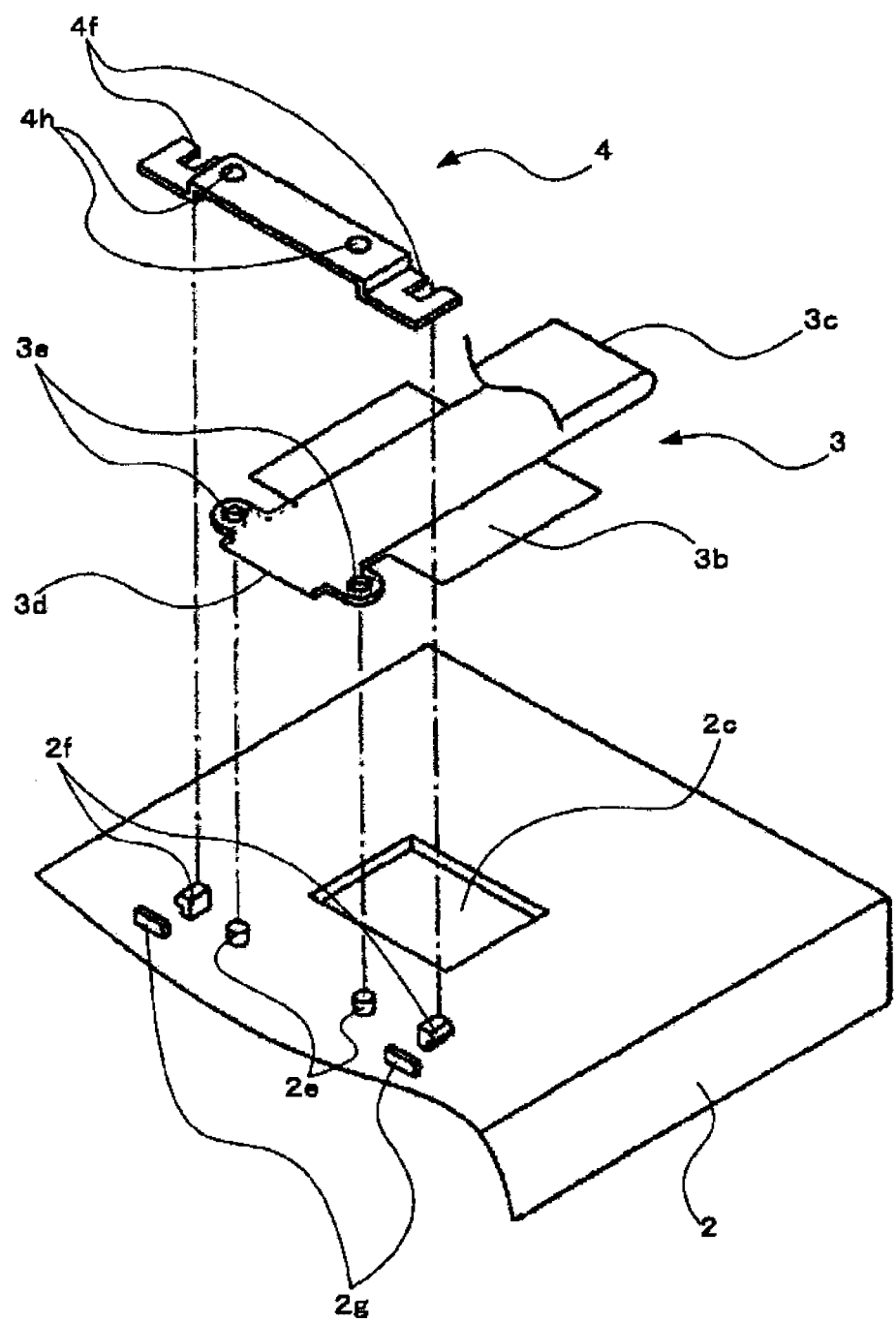
FIG. 4A is an exploded perspective view of the sliding electronic apparatus shown in FIG. 2A.
Figure 4B:
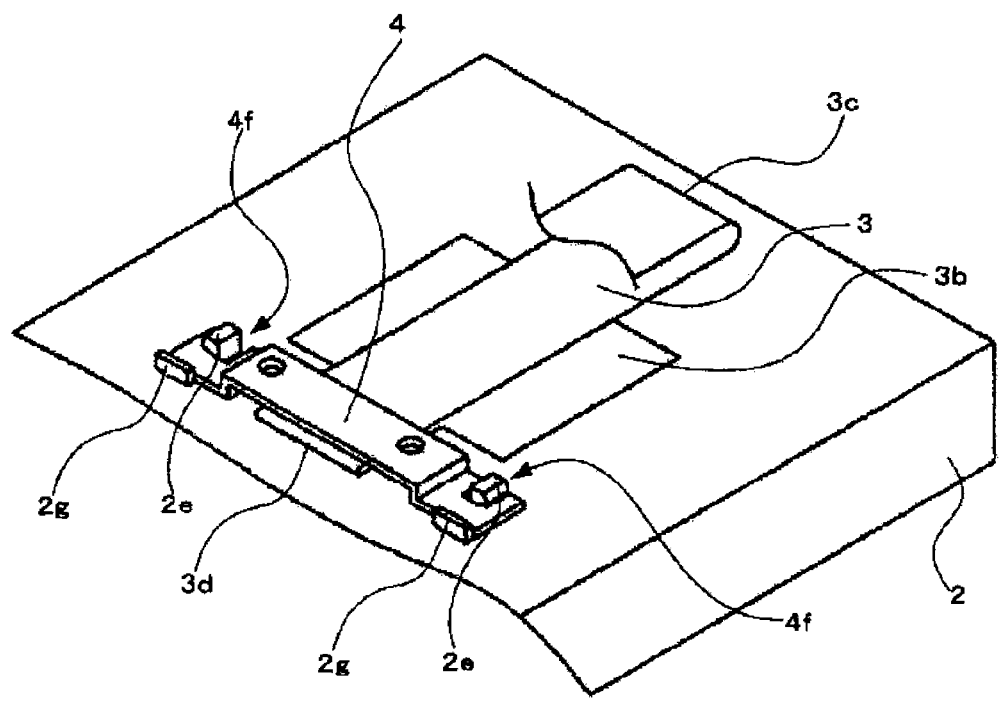
FIG. 4B is a perspective view of the sliding electronic apparatus shown in FIG. 2A.

FIG. 4A is an exploded perspective view of the sliding electronic apparatus according to the exemplary embodiment. FIG. 4B is a perspective view of the sliding electronic apparatus according to the exemplary embodiment. In FIG. 4A and FIG. 4B, the vicinity of cover portion 3*b* of FPC 3 is shown enlarged.

In the sliding electronic apparatus, the intermediate portion of FPC 3 extends backward from cover portion 3*b*, is folded upward at folded portion 3*d*, and then extends forward from folded portion 3*d* to U-shaped portion 3*c*. Furthermore, the sliding electronic apparatus includes frame 4 serving as a fixation member for fixing folded portion 3*d* of FPC 3 on the upper surface of lower housing 2. Frame 4 is formed of a metal material or a resin material.

Folded portion 3*d* of FPC 3 includes positioning holes 3*e* formed therein. Furthermore, lower housing 2 includes projections 2*e* provided on the upper surface thereof backward of opening 2*c* and corresponding to positioning holes 3*e* in FPC 3. Projections 2*e* on lower housing 2 are engaged with positioning holes 3*e* in FPC 3 to position folded portion 3*d* of FPC 3 on the upper surface of lower housing 2.

Frame 4 includes recess portions 4*f* formed at laterally opposite ends thereof and recessed backward from a front end surface. Furthermore, pawls 2*f* corresponding to recess portions 4*f* of frame 4 are provided on the upper surface of lower housing 2 close to respective projections 2*e*.

Recess portions 4*f* of frame 4 are fitted on pawls 2*f* to mount frame 4 on the upper surface of lower housing 2. Each of pawls 2*f* is shaped such that an upper portion thereof projects laterally outward. Pawls 2*f* thus engages with an upper surface of frame 4 to restrain recess portions 4*f* from slipping out upward from pawls 2*f*.

Furthermore, ribs 2*g* are provided on the upper surface of lower housing 2 and come into abutting contact with a back end of frame 4 mounted on the upper surface of lower housing 2. This prevents recess portions 4*f* of frame 4 from slipping out backward from pawls 2*f* of lower housing 2. In addition, frame 4 includes clearance holes 4*h* formed therein to prevent positioning projections 2*e* from interfering with mounting of frame 4 on the upper surface of lower housing 2.

Frame 4 is mounted on lower housing 2 with positioning holes 3*e* in FPC 3 engaging with projections 2*e* on lower housing 2 and with folded portion 3*d* positioned on the upper surface of lower housing 2. Then, folded portion 3*d* of FPC 3 is sandwiched between frame 4 and the upper surface of lower housing 2 and thus fixed on the upper surface of lower housing 2.

As described above, folded portion 3*d* of FPC 3 poisoned on the upper surface of lower housing 2 is fixed by frame 4. Thus, folded portion 3*d* is fixed to a given position on the upper surface of lower housing 2. This allows folded portion 3*d* to be prevented from being displaced from a given position during manufacture or use of the sliding electronic apparatus, thus improving the reliability of the sliding electronic apparatus.

Furthermore, since folded portion 3*d* of FPC 3 is fixed on the upper surface of lower housing 2, the intermediate portion of FPC 3 is deformed during the operation of opening or closing the sliding electronic apparatus. Thus, cover portion 3*b* is not subjected to any load. Hence, cover portion 3*b* can be prevented from being displaced from the upper surface of lower housing 2.

As described above, double sided adhesive tape 8 is arranged between cover portion 3*b* of FPC 3 and the upper surface of lower housing 2, and cover portion 3*b* of FPC 3 is covered with tape 12 (see FIG. 3). However, illustration of double sided adhesive tape 8 and tape 12 is omitted from FIG. 4A and FIG. 4B.

Figure 5A:
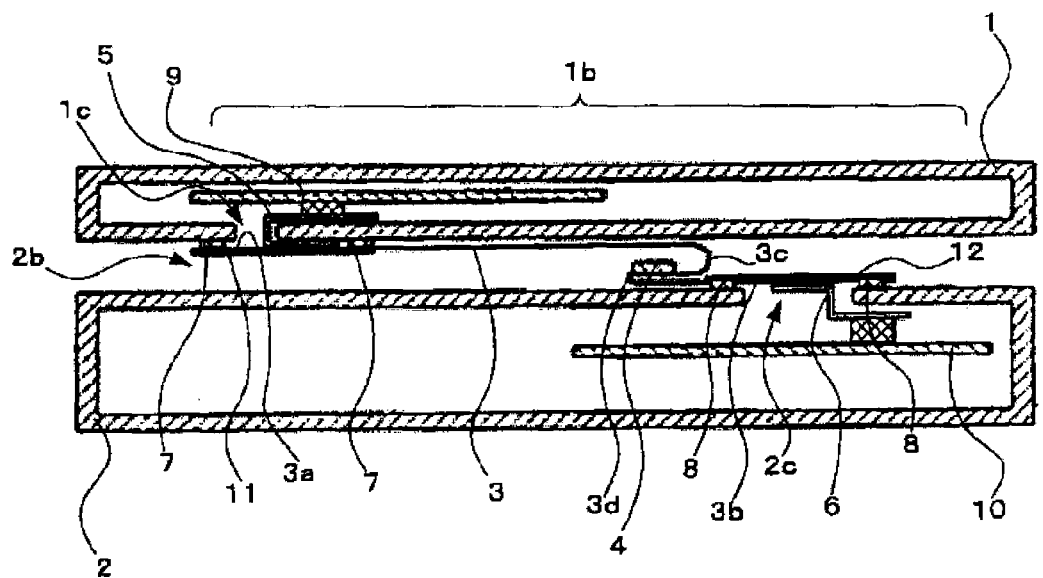
FIG. 5A is a side cross-sectional view of the sliding electronic apparatus shown in FIG. 2A and which is in the closed state.
Figure 5B:
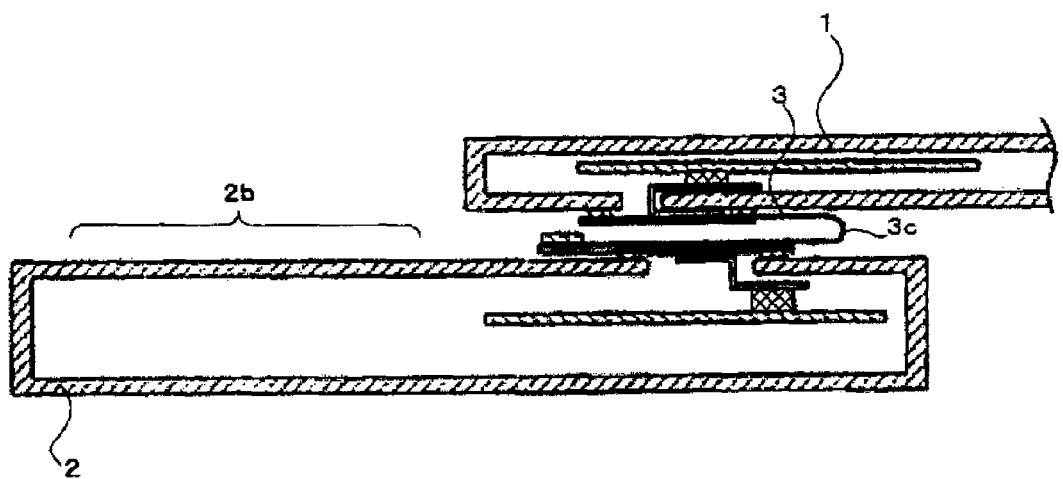
FIG. 5B is a side cross-sectional view of the sliding electronic apparatus shown in FIG. 2A and which is in the open state.

FIG. 5A and FIG. 5B are side cross-sectional views of the sliding electronic apparatus according to the present embodiment. FIG. 5A shows the closed state of the sliding electronic apparatus. FIG. 5B shows the open state of the sliding electronic apparatus.

In the closed state shown in FIG. 5A, U-shaped portion 3*c* of FPC 3 is arranged close to folded portion 3*d*. As upper housing 1 is slid forward with respect to lower housing 2, FPC 3 moves U-shaped portion 3*c* forward with the formation position of U-shaped portion 3*c* shifting toward cover portion 3*a* of the intermediate portion. As a result, the sliding electronic apparatus switches from the closed state to the open state shown in FIG. 5B.

Furthermore, in the open state shown in FIG. 5B, as upper housing 1 is slid backward with respect to lower housing 2, FPC 3 moves U-shaped portion 3*c* backward with the formation position of U-shaped portion 3*c* shifting toward cover portion 3*b* of the intermediate portion. As a result, the sliding electronic apparatus switches to the closed state shown in FIG. 5A.

As described above, in the sliding electronic apparatus, the opening and closing operations can be performed with the electric connection between wiring board 9 in upper housing 1 and wiring board 10 in lower housing 2 maintained.

In the sliding electronic apparatus, when the openings formed in the upper housing and the lower housing are both covered by the FPC, foreign matter can be prevented from entering the housings through the openings. Thus, in this case, FPC 3 need not necessarily be folded at folded portion 3*d* as in the case of the exemplary embodiment.

Figure 6:
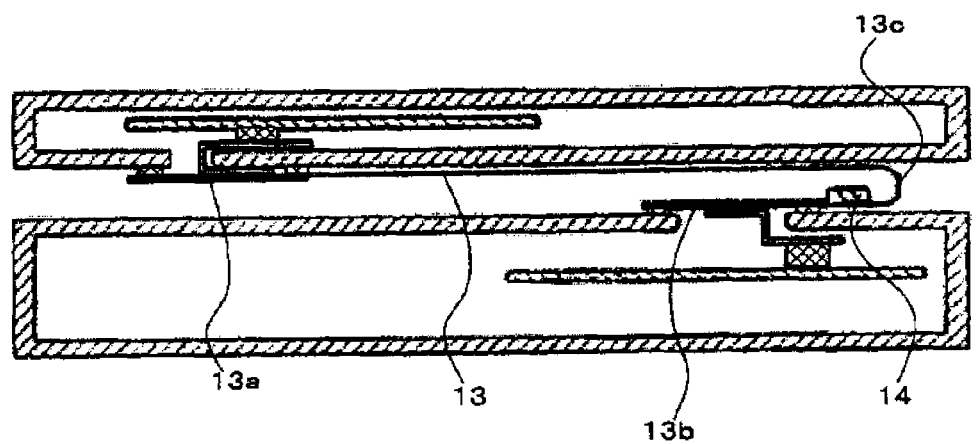
FIG. 6 is a side cross-sectional view of a modification of the sliding electronic apparatus shown in FIG. 2A and which is in the closed state.

For example, the sliding electronic apparatus may be configured as shown in FIG. 6. That is, the intermediate portion between cover portions 13*a* and 13*b* of FPC 13 may extend forward from cover portion 13*b* while FPC 13 is fixed to frame 14 in front of the opening in the upper surface of the lower housing.

However, in the sliding electronic apparatus shown in FIG. 6, U-shaped portion 13*c* is arranged in front of the opening in the lower housing. Thus, when the upper housing is moved a long distance with respect to the lower housing, U-shaped portion 13*c* protrudes forward out from the upper surface of the lower housing. Hence, in this sliding electronic apparatus, the upper housing cannot be moved a long distance with respect to the lower housing.

Thus, in the sliding electronic apparatus configured as described above, it may be difficult to provide a sufficient space for arrangement of the operation section and the like on the upper surface of the lower housing. For example, the size of the sliding electronic apparatus may need to be increased in order to provide such a space.

On the other hand, in the sliding electronic apparatus according to the exemplary embodiment, FPC 3 is folded at folded portion 3*d*. Thus, as shown in FIG. 5A, U-shaped portion 3*c* can be arranged behind opening 2*c* in lower housing 2. Hence, as shown in FIG. 5B, even though upper housing 1 is moved a long distance with respect to lower housing 2, U-shaped portion 3*c* remains in the gap between upper housing 1 and lower housing 2.

The present invention has been described with reference to the exemplary embodiment. However, the present invention is not limited to the exemplary embodiment. Various changes understandable to those skilled in the art may be made to the configuration of the present invention without departing from the scope of the present invention.

The present application claims the benefit of the priority based on JP2008-330803A filed on Dec. 25, 2008 and incorporates the entirety of the disclosure thereof.

REFERENCE SIGNS LIST

1 Upper housing
1*b* Display section
1*c* Opening
2 Lower housing
2*b* Operation section
2*c* Opening
3 FPC
3*a*, 3*b* Cover portions
3*c* U-shaped portion
3*d* Folded portion
4 Frame
5, 6 Sub-FPCs
7, 8 Double-sided adhesive tapes
9, 10 Wiring boards
11, 12 Tapes

The invention claimed is:

1. A sliding electronic apparatus in which a first housing and a second housing laid on top of each other are coupled together so as to be able to slide relative to each other, the sliding electronic apparatus being switchable, by sliding one housing, from among the first housing and the second housing, with respect to each other, between a closed state in which an operation section provided on the second housing is covered by the first housing and an open state in which the operation section is exposed, the sliding electronic apparatus comprising:

a first wiring board accommodated in the first housing; a second wiring board accommodated in the second housing; a first opening formed in an opposite surface of the first housing which lies opposite the second housing; a second opening formed in an opposite surface of the second housing which lies opposite the first housing; and a flexible printed circuit configured to electrically connect the first wiring board and the second wiring board together, wherein the flexible printed circuit includes a first cover portion mounted on the opposite surface of the first housing so as to cover the first opening, and a second cover portion mounted on the opposite surface of the second housing so as to cover the second opening, and the first cover portion is electrically connected to the first wiring board, and the second cover portion is electrically connected to the second wiring board.

2. The sliding electronic apparatus according to claim 1, wherein when the closed state is switched to the open state, the first housing moves in a first direction with respect to the second housing, and an intermediate portion of the flexible printed circuit which is located between the first cover portion and the second cover portion extends from the second cover portion in a second direction opposite to the first direction, and comprises a folded portion located away from the second cover portion in the second direction and folded toward the first direction.

3. The sliding electronic apparatus according to claim 2, wherein the folded portion is fixed to the second housing.

4. The sliding electronic apparatus according to claim 3, further comprising a fixation member for fixing the folded portion by sandwiching the folded portion between the fixation member and the second housing.

5. The sliding electronic apparatus according to claim 1, wherein the first cover portion is attached to the opposite surface of the first housing via an adhesive member, and the second cover portion is attached to the opposite surface of the second housing via the adhesive member.

6. The sliding electronic apparatus according to claim 5, wherein the adhesive member encloses the first opening and the second opening all along peripheries of the openings.

7. The sliding electronic apparatus according to claim 5, wherein the adhesive member is a double-sided adhesive tape.

8. The sliding electronic apparatus according to claim 1, further comprising a cover member configured to cover each of the first cover portion and the second cover portion.

9. The sliding electronic apparatus according to claim 8, wherein the cover member is an adhesive tape.

10. The sliding electronic apparatus according to claim 1, wherein the first cover portion is electrically connected to the first wiring board via a first connection section, and the second cover portion is electrically connected to the second wiring board via a second connection section.

11. The sliding electronic apparatus according to claim 10, wherein each of the first connection section and the second connection section comprises an independently formed flexible printed circuit.

12. The sliding electronic apparatus according to claim 11, wherein the first connection section and the first cover portion are connected together via an ACF, and the second connection section and the second cover portion are also connected together via the ACF.

13. The sliding electronic apparatus according to claim 1, wherein the flexible printed circuit comprises wiring on each of opposite surfaces thereof.

* * * * *